United States Patent [19]

Rapp

[11] 4,160,672
[45] * Jul. 10, 1979

[54] GLASS-CERAMICS FOR SEMICONDUCTOR DOPING

[75] Inventor: James E. Rapp, Oregon, Ohio

[73] Assignee: Owens-Illinois, Inc., Toledo, Ohio

[*] Notice: The portion of the term of this patent subsequent to Sept. 23, 1992, has been disclaimed.

[21] Appl. No.: 658,970

[22] Filed: Feb. 18, 1976

Related U.S. Application Data

[60] Division of Ser. No. 535,170, Dec. 23, 1974, Pat. No. 3,961,969, which is a continuation-in-part of Ser. No. 431,212, Jan. 7, 1974, Pat. No. 3,907,618.

[51] Int. Cl.² .................................................. C03C 3/22
[52] U.S. Cl. ..................................... 106/39.6; 148/22; 148/189; 252/950
[58] Field of Search ............... 252/950, 951; 106/39.6, 106/39.7; 148/22, 189

[56] References Cited

U.S. PATENT DOCUMENTS

| | | | |
|---|---|---|---|
| 3,852,086 | 12/1974 | Murata et al. | 148/189 |
| 3,907,618 | 9/1975 | Rapp | 106/39.7 X |
| 3,928,096 | 12/1975 | Vergano et al. | 148/189 |
| 3,961,969 | 6/1976 | Rapp | 106/39.6 |
| 3,962,000 | 6/1976 | Rapp | 148/189 |

*Primary Examiner*—G. Ozaki
*Attorney, Agent, or Firm*—Charles S. Lynch; E. J. Holler

[57] ABSTRACT

Disclosed are $B_2O_3$-containing glass-ceramic bodies made by in situ thermal crystallization of glasses and useful as a host for diffusion doping of semiconductors by the vapor phase transport of $B_2O_3$ to the semiconductor from the glass-ceramic which in mole percent consists essentially of $SiO_2$ 15–40, $Al_2O_3$ 15–30, $B_2O_3$ 20–60, RO 5–25, $La_2O_3$ 0–5, $Nb_2O_5$ 0–5 and $Ta_2O_5$ 0–5 wherein RO is selected from MgO, CaO, SrO and BaO in specified percentages, and mixtures thereof and wherein the ratio $Al_2O_3$ to RO is 1.5–4.

2 Claims, 3 Drawing Figures

GLASS-CERAMICS FOR SEMICONDUCTOR DOPING

This application is a division of Ser. No. 535,170 filed 12/23/74, which matured into U.S. Pat. No. 3,961,969, issued June 8, 1976 and which is a continuation-in-part of Ser. No. 431,212 filed 1/7/74, now U.S. Pat. No. 3,907,618.

This invention is an improvement over the invention of commonly assigned copending application entitled "Boron Doping of Semiconductors" Ser. No. 431,211 filed 1/7/74, now U.S. Pat. No. 3,928,096 and relates to diffused-junction type semiconductor devices, and especially to a new method for diffusing boron into silicon and germanium semiconductors. More particularly, the present invention pertains to glass-ceramic bodies suitable for use in a precise and readily controllable method for diffusing a boron-containing layer in at least a portion of the surface of a semiconductor for the purpose of forming a semiconductor junction therein.

Semiconductors have been known in the industry for many years, and the term semiconductor element has been considered generic to silicon, germanium and silicon-germanium alloys. As used herein, the term "semiconductor" is intended to mean such silicon, germanium and silicon-germanium alloy semiconductor elements. Such elements can be circular, rectangular or triangular or any other convenient geometric shape, although they are usually in the form of a wafer or disc in most commercial situations.

Such silicon semiconductors have an active impurity incorporated therein during manufacture or later by diffusion, which impurity affects the electrical rectification characteristics of the semiconductor as distinguished from other impurities which may have no appreciable effect on those characteristics. Active impurities are usually classified as donor impurities or acceptor impurities. The donor impurities include phosphorus, arsenic and antimony and the acceptor impurities include boron, gallium, aluminum and indium. In other cases, the silicon semiconductors are essentially free of such impurities and are called "intrinsic" semiconductors.

With respect to the nomenclature used in the semiconductor art, a zone of semiconductor material containing an excess of donor impurities and yielding an excess of free electrons is said to exhibit N type conductivity. On the other hand, P type conductivity is exhibited by a zone containing an excess of acceptor impurities resulting in a deficit of electrons or an excess of "holes." In other words, N type conduction is characterized by electron conduction whereas a P type conduction is one characterized by hole conduction. "Intrinsic" (sometimes called "I" type) silicon semiconductors contain neither donor or acceptor impurities.

When a continuous solid specimen of semiconductor material has an N type zone adjacent to P type zone, the boundary between them is termed a P-N or N-P junction and the specimen of semiconductor material is termed a P-N junction semiconductor device. When a zone of P type conductivity is adjacent a zone of greater P type conductivity, the junction is called a P-P+ junction. When a zone of N type conductivity is adjacent a zone of greater N type conductivity, the junction is called an N-N+ junction. Semiconductor junctions of the P-I type and N-I type also exist. The present invention encompasses the diffusion doping of boron to form P (including "P+") zones in the above types of semiconductor devices.

Semiconductors have application and utility for purposes such as rectifiers, transistors, photodiodes, solar batteries, semiconductor controlled rectifiers and other devices. In addition to general electronic applications, the P-N junction semiconductor is frequently used as a radiation detector of charged particle detector.

Commonly assigned, copending application Ser. No. 431,211 filed 1/7/74, now U.S. Pat. No. 3,928,096, entitled "Boron Doping of Semiconductors" discloses $B_2O_3$ containing glass-ceramic dopant hosts in the form of thin wafers which do not significantly deform at doping temperatures in the neighborhood of 1000° C. The present invention represents an improvement over this copending application in that it provides a specific family of $B_2O_3$ containing glass-ceramic dopant hosts which are thermally stable and rigid at doping temperatures in excess of about 1050° C. The preferred range of glass-ceramic dopant host compositions are rigid at temperatures in the 1100°–1200° C. range even when in the form of thin wafers. Furthermore, the parent glass compositions which are thermally crystallized to form these improved glass-ceramic dopant hosts are readily melted and are resistant to uncontrolled devitrification.

The primary feature of the present invention is that it provides for the incorporation of as high as 60 mole percent $B_2O_3$ in the glass-ceramic dopant hosts while maintaining rigidity and dimensional stability during high temperature doping. This feature is extremely important because the rate at which $B_2O_3$ vapors are generated by the glass-ceramic dopant host during doping, generally increases as the concentration as $B_2O_3$ in the dopant host increases. Unfortunately the thermal stability and rigidity of glass-ceramic materials in thin sections usually decreases with increasing $B_2O_3$ concentration. The present invention provides the unique and desirable combination of high concentration of $B_2O_3$ in the glass-ceramic dopant host as well as thermal stability and rigidity at temperatures in excess of 1050° C., even when the dopant host is in the form of a thin wafer.

The above and other features and advantages of the present invention will become apparent from the following detailed description thereof taken in conjunction with the drawing wherein.

Figure 1:
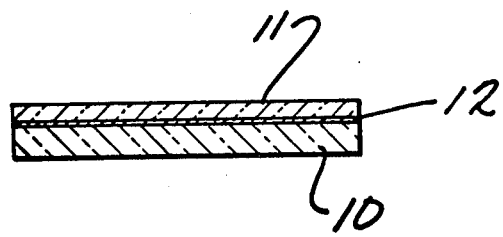
FIG. 1 is a cross-sectional view of the semiconductor body, having been processed in accordance with the method described herein.

The present invention overcomes the difficulties of the prior art methods by utilizing a rigid, dimensionally stable, substantially alkali metal oxide free alkaline earth aluminoborosilicate glass-ceramic dopant host as a dopant source or host for varpor phase transport of $B_2O_3$ to the semiconductor. According to the present invention, the glass-ceramic dopant host is maintained in vapor phase communication (with or without the presence of a carrier gas) with a semiconductor at a temperature and for a time sufficient to transport $B_2O_3$ from the dopant host to the surface of the semiconductor. The semiconductor so treated is then heated, with or without the continued presence of the glass-ceramic dopant host for a time sufficient to permit diffusion of boron into the semiconductor to the desired depth.

A commercially significant embodiment of the invention is an N type silicon semiconductor which has formed therein a boron-containing layer defining a P type zone. The reverse side of the silicon chip or wafer retains its N type nature and, accordingly, the product produced by this invention is a P-N junction semiconductor device.

The invention is described in terms of the "vapor phase transport of $B_2O_3$" for lack of a clear understanding of the boron-containing species vaporized from the glass-ceramic host. Accordingly, this term includes whatever boron-containing species is responsible for the transport effect. Similarly, the diffusion process is discussed in terms of "boron diffusion" into the semiconductor for lack of a clear understanding of the boron-containing species actually being diffused. Accordingly, this term includes whatever boron-containing species is responsible for the diffusion doping effect.

Boron is deposited from the vapor phase onto the surface of the semiconductor and diffuses to a controlled depth within the silicon wafer. The concentration and depth of the junction is proportional to the time and temperature of the doping and diffusing process.

The glass-ceramic dopant host must be rigid and dimensionally stable at the doping temperatures so that deformation is not a problem when the dopant source is planar in configuration. In planar diffusion doping, a planar surface of a solid dopant host and a planar surface of the semiconductor to be doped are positioned parallel in spaced confronting relationship during the diffusional heat treatment. In that the concentration of $B_2O_3$ on the surface of the semiconductor is a function of the distance between the planar surfaces, dimensional stability of the dopant host is of the utmost importance in achieving uniformity in boron distribution on the surface of the silicon semiconductor.

The glass-ceramic dopant hosts particularly useful for practicing the present invention are formed from certain alkaline earth alumino borosilicate glasses which are substantially free of alkali-oxide. By substantially alkali-free, it is meant that the glasses do not contain sufficient alkali oxides (e.g., $K_2O$, $Na_2O$, and $Li_2O$) to yield a vapor phase containing such oxides at the doping temperatures. It has been found that presence of such alkali oxides in the vapor phase contributes undesirable conductivity characteristics to the resulting semiconductor. In the usual practice of the present invention, the combined alkali oxides are less than about 0.5 mole % and preferably less than 0.1 mole % of the glass-ceramic dopant composition. Preferably the alkali oxides are absent altogether, although this is not always possible because batch materials often contain alkali oxides as impurities.

The term "glass-ceramic" body is used herein according to its conventional meaning and refers to a semicrystalline ceramic body which is composed of at least one crystalline phase randomly dispersed in a residual glassy phase or matrix. Such crystalline phase is formed by the in-situ thermal crystallization of a parent glass composition.

The heat treatment process for forming glass-ceramics from a parent glass usually include a nucleation stage at substantially the temperature of the annealing point (viscosity $10^{13}$ poises) of the parent glass, a development stage at a temperature below the fiber softening point of the parent glass (preferably at a viscosity in the range of $10^8$ to $10^{12}$ poises), and a crystallization stage (at a temperature preferably 150° to 300° F. above the fiber softening point of the parent glass (i.e., viscosity of $10^{7.65}$ poises).

Although the crystallization process itself is not the subject of the present invention, the following description is given in the interest of completeness of disclosure. The parent glass to be crystallized is heated to a temperature corresponding to a viscosity of about $10^{13}$ poises and maintained at this temperature long enough to permit the formation of submicroscopic crystals dispersed throughout a glassy matrix. This is commonly known as the nucleation. The time required for the nucleation period varies according to the composition and is typically from ¼ to 24 hours.

The glassy matrix containing the nucleated crystals is then heated to a temperature corresponding to a viscosity of approximately $10^8$ poises. This thermal condition is maintained for a sufficient time to permit partial crystallization to form a rigid, crystalline structure. The submicroscopic nuclei dispersed in the glassy matrix as a result of the nucleation phase act as growth centers for the rigid framework formed during this second or development stage of the heating cycle. The development stage varies with composition and is typically ¼ to 4 hours. The purpose of the development phase is to provide a rigid skeletal-crystal framework to support the remaining matrix when the temperature is raised to complete crystallization.

This glass-ceramic body is then formed by heating to a temperature of 150° to 300° F. above the temperature corresponding to the viscosity of $10^{7.65}$ poises of the parent glass. This temperature is maintained until the desired degree of crystallinity is obtained. The final crystallization phase of the heat treating cycle is typically ¼ to 4 hours at the highest practical temperature which does not cause the glass ceramic to flow. This heat treatment promotes high temperature dimensional stability in the finished glass-ceramic. This heat treatment temperature is in the neighborhood of the solidus temperature.

In actual practice, it has been found that all three stages of the heating process can be accomplished by continuously advancing the temperature through regions of nucleation, development and crystallization. In many compositions of the present invention, it has been found that a "formal" development stage is not required because the time required to heat the article from the nucleation temperature to the crystallization temperature is sufficient. Additional details for forming glass-ceramic bodies are described in U.S. Pat. No. 3,117,881, the disclosure of which is incorporated by reference.

In practicing the present invention, the glass-ceramic dopant host is formed from an alkaline earth alumino borosilicate parent glass which is substantially free of alkali metal oxides and consisting essentially of the following ingredients on a molar percent basis.

| Component | Broad Range Mole % |
|---|---|
| $SiO_2$ | 15–40 |
| $Al_2O_3$ | 15–30 |
| $B_2O_3$ | 20–60 |
| RO | 5–25 |
| Wherein $4 \geq \frac{Al_2O_3}{RO} \geq 1.5$ | |
| Wherein RO is: | |
| MgO | 0–15 |

-continued

| Component | Broad Range Mole % |
| --- | --- |
| CaO | 0–10 |
| SrO | 0–10 |
| BaO | 0–15 |
| $La_2O_3$ | 0–5 |
| $Nb_2O_5$ | 0–5 |
| $Ta_2O_5$ | 0–5 |

Usually the sum total of alkali metal oxides is less than about 0.5 mole % and preferably less than 0.1 mole % in the above compositions.

In the above composition range the BaO content is usually 0–10 mole %, although compositions containing up to 15 mole % are quite satisfactory.

In a preferred practice of the present invention, within the above range the composition consists essentially of:

| Component | Preferred Range Mole % |
| --- | --- |
| $SiO_2$ | 18–40 |
| $Al_2O_3$ | 15–30 |
| $B_2O_3$ | 30–60 |
| RO | 5–15 |

Wherein $4 \geq \dfrac{Al_2O_3}{RO} \geq 2$

Wherein the MgO component of RO is at least about 3% of the total composition.

As will be apparent from the examples that follow the combination of MgO with CaO, SrO, and/or BaO improves the resistance to uncontrolled devitrification in the parent glass. The presence of $La_2O_3$, $Nb_2O_5$, and $Ta_2O_5$ contribute to the melting and formation of parent glass compositions having high proportions (e.g. greater than about 50 mole %) $B_2O_3$ which are resistant to uncontrolled devitrification.

In addition to the above oxides, the term "consisting essentially of" is intended to include minor proportions (i.e. up to about 10 mole %) of other than alkali oxides such as glass forming oxides, modifying oxides, nucleant oxides (e.g. $TiO_2$ and/or $ZrO_2$) and refining aids, when such ingredients are not detrimental to the semiconductor doping and are required to achieve specific chemical or physical properties.

The ratio $Al_2O_3$/RO is important from the standpoint of glass formability and high temperature stability in the resulting glass-ceramic dopant host. When the ratio of $Al_2O_3$/RO is less than about 1.5, the glass-ceramic dopant host wafers may have a tendency to deform at doping temperatures in the neighborhood of 1100° C.–1200° C. When the ratio of $Al_2O_3$/RO is greater than about 4 it becomes more difficult to melt and form the parent glass.

In accordance with one embodiment of the present invention and with reference to the attached drawings, a suitable N type silicon substrate 10 is prepared by any of the known techniques of obtaining monocrystalline bodies of silicon. For example, a monocrystalline ingot can be formed of highly purified silicon. The ingot is cut into transverse slices and the slices are diced to form silicon wafers of the desired dimension. The surface of the substrate can be prepared by suitable cleaning and polishing. However, the polished and cleaned semiconductive silicon materials can be commercially purchased. Polishing or cleaning of the surface can be accomplished by mechanical means such as lapping or the like or by chemical means, such as etching which is well understood in the art and does not form a part of the present invention.

Furthermore, the N type silicon wafer can be part of a complex semiconductor device and already have one or more P-N junctions arranged in any geometric pattern therein. The only important feature is that at least a part of the exposed surface of the silicon wafer exhibit "N" type of conduction. Accordingly, the term "N" type silicon as used herein includes such complex semiconductor devices having alternating zones of P and N type conduction.

For conventionally grown crystals, the surface may be chemically polished with a suitable etchant; for example, a concentrated solution of three parts hydrofluoric acid, three parts acetic acid and five parts nitric acid, by volume. Alternatively, the surface may be prepared by lapping or etching with a hot solution of water containing about 10% sodium hydroxide at ambient temperature and up to about 90° C. These cleaning and etching operations function for the purpose of removing contaminants from the surface and to make the surface uniform with a high degree of smoothness. These preparatory operations are well understood in the art.

Formation of P-N junctions of the present invention have been found to occur to a desirable extent on N-type silicon having a resistivity of about 10 ohm-centimeters. It is, of course, readily apparent that the precise size and nature of the wafer is not critical. For example, wafers conventionally used can be 1, 2, or 3 inches in diameter or even more. The thickness can range from 5 to 20 mils, although this can vary. Typical wafers are 8 to 10 mils thick. Likewise, the resistivity of suitable N-type silicon starting materials ranges from about 0.1 to about 100 ohm-centimeters.

An oxide layer 11 is grown on the surface of wafer 10 in accordance with this invention. The wafer is heated in the vapors of $B_2O_3$ so that a film or coating is formed over at least a portion of the surface of the wafer. A mask or protective covering can be utilized so as to develop any pattern as is understood in the art. The coating or film 11 is of glassy nature and contains boron in one form or another.

The temperature of this operation is such that simultaneously, some boron diffuses from the film or deposit 11 into the wafer 10 forming a thin boron diffused surface layer on region 12 adjacent the coating 11. The region 12 is a boron diffused layer 11 into the N conductivity silicon 10. The juncture depth can vary, but in general, it is up to about 10 microns in thickness. The minimum thickness can vary and illustratively is about 0.1 micron.

Figure 2:
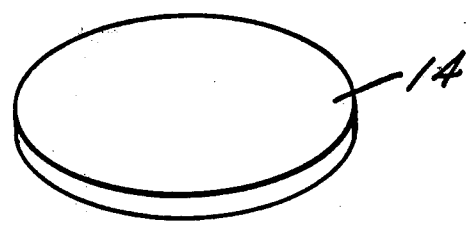
FIG. 2 is an isometric view of a solid $B_2O_3$-containing glass-ceramic dopant wafer as described herein.

FIG. 2 shows a disc or wafer 14 of the $B_2O_3$-containing glass-ceramic dopant host, which functions as the source of $B_2O_3$ vapors for contact with the silicon wafers.

When positioned in a suitable furnace used for the invention, and when subjected to temperatures in the range of 700° C. to 1250° C., more particularly 1050° C. to 1200° C., the glass-ceramic dopant wafer liberates $B_2O_3$ vapors, which vapors then flow through the furnace high temperature zone in the direction of contacting the silicon wafers positioned in the vicinity of the dopant wafer. Generally, the method comprises diffusing boron into a semiconductor silicon element by positioning at least one semiconductor silicon element in a furnace, positioning a solid dopant wafer, disc or similar body in the furnace in the vicinity of, but not in physical contact with the silicon element, and then subjecting the silicon element and glass-ceramic dopant to an elevated temperature in the range mentioned above. At these temperatures the dopant liberates $B_2O_3$ vapors which vapors then pass through the furnace and contact at least a portion of the surface of the silicon element. This process is conducted for a sufficient period of time to permit the diffusion of the boron into at least one portion of the surface of the silicon element to form a diffused region therein. After the $B_2O_3$ vapors react with the hot silicon surface, the elemental boron diffuses into the silicon chip with continued heating. This boron diffusion step can be conducted in the absence of the glass-ceramic dopant wafer if desired.

As a further aspect to this embodiment of the invention, the doping process is further controlled and enhanced by the use of free-flowing inert carrier gas such as argon, or nitrogen. As used here, the expression "inert gas" means that the carrier gas does not enter into the chemical reaction between the $B_2O_3$ vapors and the hot silicon surface.

Figure 3:
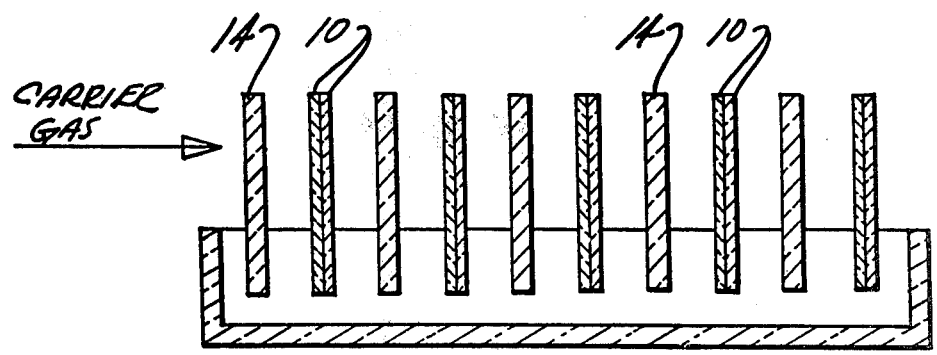
FIG. 3 is an elevation view showing a refractory container in which a plurality of solid wafers of the $B_2O_3$-containing glass-ceramic and a plurality of silicon wafers are arranged for practicing the present invention.

This is shown in FIG. 3, wherein the carrier gas enters from the left and passes across wafer 14 where the $B_2O_3$ is released and contacts the exposed surfaces of the silicon wafer 10. By placing two silicon wafers back-to-back, the reverse side of each of the silicon chips receives no boron from the process and consequently retains its original character as an N type silicon. Following the doping process, the diffusion depth can be further increased to diffuse the junction deeper by a simple heat treatment in an inert atmosphere. This can be carried out in a separate furnace if desired. The process has been described in terms of silicon semiconductors because of their commercial importance, although the same process can be applied to germanium semiconductors. Somewhat lower doping temperatures are employed in the doping of germanium because of its 937° C. melting point.

In preparing the glass-ceramic dopants, suitable compositions containing appropriate raw materials can be melted to form a homogeneous glass. Illustratively, compositions described above can be melted to form a homogeneous glass at 1500° C. to 1650° C. in a refractory vessel. Generally, this melting procedure requires about 15 minutes to several hours to achieve homogeneity. It can be desirable to add additional $B_2O_3$ to the melt to account for losses due to volatilization. It is desirable to keep the melting time as short as possible in order to reduce the losses due to volatilization. Also, the batch material should be as pure as possible so as to minimize the presence of impurities.

The dopant host can be produced in a number of ways. The parent glass can be melted from metal organic derived materials to minimize the content of undesirable ingredients as disclosed in commonly assigned U.S. Pat. No. 3,640,093, the disclosure of which is incorporated by reference, or it can be melted from conventional high purity glassmaking ingredients.

Clearly, the presence of impurities can deleteriously affect the electrical performance of the doped silicon semiconductor device. Impurities specifically to be excluded or held at an absolute minimum are the oxides of the alkalis, i.e., $Li_2O$, $Na_2O$, $K_2O$, $Cs_2O$, or $Rb_2O$ and other high vapor pressure components such as PbO, $SnO_2$, and CuO.

After the glass compositions are melted and formed into a homogeneous molten mass, the glasses can be cast into any desired shape. Conveniently, this can be carried out by casting the glass into preheated graphite molds in the shape of right circular cylinders of a diameter approximating that of the finished diffusion disc. The glass can be permitted to cool and when cold the glass billet or cylinder is removed and inspected for flaws and then sliced into wafers usually ranging from 0.025 inches to 0.050 inches in thickness, although wafers having a thickness of up to 0.100 inches and above are employed in some applications. At this point, the glass wafers are in a form for conversion to a glass-ceramic. Alternatively, the glass billet or a core drilled section can be heat treated to form the glass-ceramic in which glass-ceramic is then sliced into wafers. Because of the very close control made possible by the present invention, a plurality of silicon elements can be treated by appropriate positioning of a plurality of glass-ceramic dopant wafers arranged in a boat as shown in FIG. 3.

In carrying out this aspect of the invention, the doping is accomplished by placing the glass-ceramic dopant chips near and parallel to, but not touching, the silicon wafer to be doped. Generally, for best results, the distance has been determined to be about ⅛ inch. In a multi-slotted fused silica boat or other refractory vessel, container or the like, as many as 100 or more silicon chips or wafers can be doped to a uniform level by alternately spacing a glass-ceramic wafer, and a pair of wafers in back-to-back contact with confronting faces, silicon wafers and glass-ceramic wafers, being substantially parallel. The general arrangement can be as shown in FIG. 3.

Time and temperature of doping conditions are selected to give the appropriate P-N junction depth and sheet resistivity for the desired device configuration. This is shown in the examples that follow.

Spacing of the chips in the boat and selection of ambient inert carrier gas and the flow rate are based on requirements that silicon chips facing in the direction of the ambient gas flow receive equivalent doping to those facing counter to the flow.

The invention will be further explained in the examples that follow wherein all percentages are in mole percentages and temperatures are in °C. unless stated otherwise.

EXAMPLE 1

Part A

Conventional high purity batch materials are melted in a platinum crucible at 1540° C. for 5 to 6 hours with manual stirring to yield a clear molten homogeneous glass having the following composition.

|  | Mole % | Weight % |
|---|---|---|
| $SiO_2$ | 15.7 | 12.8 |
| $B_2O_3$ | 41.3 | 39.3 |
| $Al_2O_3$ | 28.7 | 40.0 |
| MgO | 14.3 | 8.0 |

The molten glass is removed from the furnace and cooled to room temperature. The glass, still in the crucible, is transferred to an annealing oven maintained at 650° C. The glass is annealed at 650° C. for ½ hour and then removed and cooled to room temperature.

Part B

Crystallization Heat Treatment

The crucible with the clear glass contents is placed in a heat treatment furnace and the temperature raised to 690° C. The crucible is held at 690° C. for 3 hours. The temperature is then raised to 805° C. and the crucible is held at 805° C. for 1 hour. The temperature is then raised to 1100° C., and the crucible is held at 1100° C. for 1 hour. The furnace is then turned off and allowed to cool to room temperature before removing the crucible. The resulting nonporous glass-ceramic material has a milky-white appearance. The glass-ceramic material is cored with a 1¼ inch diameter hole saw and sliced into thin wafers ranging in thickness from about 15 to 40 mils with a diamond saw.

Part C

Planar Diffusion Doping

Planar diffusion doping is accomplished by placing some of the glass-ceramic wafers of Part B about ⅛ to ¼ inch from, and a parallel confronting relationship to, the silicon wafers to be doped. The glass-ceramic wafers and silicon wafers are arranged in multi-slotted, fused silica trays by alternately spacing a glass-ceramic wafer, and so on. The general assembly is as shown in FIG. 3.

The silicon wafers used in this example originally are N-type, and have a resistivity of about 9 ohm-cm.

The assembly is placed in a diffusion furnace and argon gas is passed therethrough as an inert carrier gas as shown in FIG. 3 at the rate of 500 cc/minute, while the doping period and temperature is maintained as indicated below.

At the end of this diffusion doping period, the silicon wafer is cooled to room temperature and cleaned with dilute hydrofluoric acid.

The surface of the doped silicon wafers exhibit P-type conductivity. Surface testing of the doped wafers with a four-point conductivity probe. The surface resistivities in ohms per square of the resulting doped silicon sample is set forth below as a function of temperature. The conductivity of the doped silicon is P type.

Spacing ⅛ to ¼" - Flow rate: 500cc/min. Argon

| Temperature | (Time (hrs.)) | | | |
|---|---|---|---|---|
| | ½ | 1 | 2 | 4 |
| 950° C. | 71.0 | 64.7 | 56.0 | 54.5 |
| 1000° C. | 54.5 | 42.7 | 38.5 | 26.8 |
| 1078° C. | 16.7 | 14.0 | 10.0 | 6.5 |

The dopant disc has not significantly slumped or otherwise deformed at the end of the diffusion doping process. When doping an N type germanium semiconductor according to the present invention, somewhat lower temperatures are employed because germanium melts at 937° C.

Several more diffusion doping tests are conducted by the above procedure except that the time and temperature are varied as set forth below. In each case the doped silicon wafer exhibited P type conductivity.

Sheet Resistivity of P Doped Silicon Wafer (Ω/square)

| Temperature (°C.) | Time (Hours) | | | |
|---|---|---|---|---|
| | ½ | 1 | 2 | 4 |
| 1000 | 48 | 42 | 30 | 25 |
| 1025 | 32 | 17 | 12 | 16 |
| 1040 | 26 | 20 | 14 | 10 |
| 1050 | 18 | 13 | 10 | 8 |

EXAMPLES 2-40

Glass-ceramic dopant host wafers are prepared from glasses of the composition as set forth in the following Tables I and II. The procedure for melting and crystallizing the glasses are like those described in Example 1 except the temperatures are maintained as indicated in the Tables and the molten glass is quenched by casting as a slab into a shallow metal tray at room temperature rather than annealing as in Part A of Example 1. Table I concerns compositions wherein MgO is the only "RO" components and Table II illustrates various combinations of "RO" components.

An arbitrary "Sag Test" is reported in the table below. In this test, glass bars approximately ⅛ inch square and about 1⅛ inch in length are prepared from the indicated glass and crystallized to a glass-ceramic body by the crystallization heat treatment indicated. After crystallization each glass-ceramic bar is ground to flatness on both sides so that the finished dimensions are 1⅛ inch × ⅛ inch × 1/16 inch. Each glass-ceramic bar is then placed across a platinum vessel ⅜ inch wide, (with ⅛ inch dimension of the bar resting on the vessel) and held at a temperature ranging from 1000° to 1250° for ½ hour. The distance that the 1/16 inch thickness "sagged" or deflected from flatness gives an arbitrary indication of the resistance to thermal deformation. While the amount of thermal deformation or sagging that can be tolerated varies with sample thickness, doping time and doping temperature in any situation, a sagging of greater than about 0.3 mm in the above procedure approximately corresponds to the maximum allowable deformation for a very thin (e.g. about 20 mil thickness) doping wafer about 1-1⅛ inches in diameter in doping assembly like that shown in FIG. 3. Thicker glass-ceramic dopant shapes can be employed for higher temperatures.

The data in the Tables indicates that the tendency for deformation increases with increasing temperatures although good thermal stability is observed for very thin glass-ceramic bars at temperatures in excess of 1050° C. and even as high as 1250° C.

Table I

| Example # | 2 | 3 | 4 | 5 | 6 | 7 |
|---|---|---|---|---|---|---|
| Mole % | | | | | | |
| $SiO_2$ | 15.7 | 36.0 | 24.0 | 30.0 | 30.0 | 37.5 |
| $Al_2O_3$ | 28.7 | 26.7 | 26.7 | 26.7 | 23.3 | 21.7 |
| $B_2O_3$ | 41.3 | 24.0 | 36.0 | 30.0 | 35.0 | 30.0 |
| MgO | 14.3 | 13.3 | 13.3 | 13.3 | 11.7 | 10.8 |
| $Al_2O_3$/MgO | 2 | 2 | 2 | 2 | 2 | 2 |
| Glass Appearance | some crystals | clear | clear | clear | clear | opal |
| Crystallization Heat Treatment | | | | | | |
| °C. for 16 Hours | 700 | 700 | 700 | 700 | 700 | 700 |
| + | | | | | | |
| °C. for 1 Hour | 1260 | 1260 | 1200 | 1200 | 1200 | 1260 |
| Sag Test Deflection in mm at °C. for ½ hour | | | | | | |

Table I-continued

| | | | | | | |
|---|---|---|---|---|---|---|
| 1000 | 0 | 0 | 0 | 0 | 0 | 0 |
| 1100 | 0 | 0 | 0 | 0 | 0 | 0 |
| 1200 | 0.3 | 0 | 0 | 0 | 0 | 0 |
| 1250 | 0.5 | 0.2 | 0 | 0.2 | 0.2 | 0.2 |
| Sheet Resistivity (Ω/□) after "p" doping at ½ hour at °C. | | | | | | |
| 1000 | 38 | | 29 | 30 | 19 | 32 |
| 1100 | 8 | | 7 | 7 | 5 | 7 |
| 1200 | 2 | 2 | 2 | 2 | 2 | 2 |
| Example # | 8 | 9 | 10 | 11 | 12 | 13 |
| Mole % | | | | | | |
| $SiO_2$ | 35.0 | 22.5 | 30.0 | 25.0 | 20.0 | 23.0 |
| $Al_2O_3$ | 20.0 | 21.7 | 20.0 | 23.3 | 26.7 | 25.7 |
| $B_2O_3$ | 35.0 | 45.0 | 40.0 | 40.0 | 40.0 | 38.5 |
| MgO | 10.0 | 10.8 | 10.0 | 11.7 | 13.3 | 12.8 |
| $Al_2O_3/MgO$ | 2 | 2 | 2 | 2 | 2 | 2 |
| Glass Appearance | opal | opal | opal | some crystals | some crystals | some crystals |
| Crystallization Heat Treatment | | | | | | |
| °C. for 16 Hours + | 700 | 700 | 700 | 700 | 700 | 700 |
| °C. for 1 Hour | 1260 | 1260 | 1260 | 1260 | 1260 | 1260 |
| Sag Test Deflection in mm at °C. for ½ hour | | | | | | |
| 1000 | 0 | 0 | 0 | 0 | 0 | 0 |
| 1100 | 0 | 0 | 0 | 0 | 0 | 0 |
| 1200 | 0 | 0.2 | 0.2 | 0 | 0 | 0 |
| 1250 | 0.2 | 1.6 | 0.9 | 0.5 | 0 | 0.7 |
| Sheet Resistivity (Ω/□) after "P" doping at ½ hour at °C. | | | | | | |
| 1000 | 27 | 29 | 28 | 29 | 28 | 26 |
| 1100 | 5 | 7 | 8 | 8 | 9 | 8 |
| 1200 | 2 | 2 | 2 | 2 | 2 | 2 |
| Example 190 | 14 | 15 | 16 | 17 | 18 | |
| Mole % | | | | | | |
| $SiO_2$ | 25.0 | 20.0 | 23.0 | 20.0 | 25.0 | |
| $Al_2O_3$ | 21.0 | 22.5 | 23.1 | 20.0 | 16.7 | |
| $B_2O_3$ | 40.0 | 42.5 | 38.5 | 50.0 | 50.0 | |
| MgO | 14.0 | 15.0 | 15.4 | 10.0 | 8.3 | |
| $Al_2O_3/MgO$ | 1.5 | 1.5 | 1.5 | 2 | 2 | |
| Glass Appearance | clear | clear | clear | opal | some crystal | |
| Heat Treatment | | | | | | |
| °C. for 16 Hours + | 700 | 700 | 700 | 700 | 700 | |
| °C. for 1 Hour | 1260 | 1260 | 1260 | 1260 | 1260 | |
| Sag Test Deflection in mm at °C. for ½ hour | | | | | | |
| 1000 | 0 | 0 | 0 | | | |
| 1100 | 0 | 0 | 0 | 0.2 | 0 | |
| 1200 | 2.8 | >3 | 2.6 | 0.5 | 0.6 | |
| 1250 | | | | >3 | >3 | |
| Sheet Resistivity (Ω/□) after "P" doping at ½ hour at °C. | | | | | | |
| 1000 | | | | 33 | 35 | |
| 1100 | 9 | 9 | 9 | 9 | 10 | |
| 1200 | | | | | | |

Table II

| Example # | 19 | 20 | 21 | 22 | 23 | 24 |
|---|---|---|---|---|---|---|
| Mole % | | | | | | |
| $SiO_2$ | 25.0 | 25.0 | 25.0 | 15.7 | 15.7 | 15.7 |
| $Al_2O_3$ | 16.7 | 16.7 | 16.7 | 28.7 | 28.7 | 28.7 |
| $B_2O_3$ | 50.0 | 50.0 | 50.0 | 41.3 | 41.3 | 41.3 |
| RO | 8.8 | 8.8 | 8.8 | 9.3 | 9.3 | 11.3 |
| MgO | 3.3 | 3.3 | 3.3 | 9.3 | 9.3 | 11.3 |
| CaO | 5.0 | | | | | |
| SrO | | 5.0 | | | | |
| BaO | | | 5.0 | | | |
| $Al_2O_3$RO | 2 | 2 | 2 | 3.1 | 3.1 | 2.5 |
| $La_2O_3$ | | | | | 5.0 | 3.0 |
| $Nb_2O_5$ | | | | | 5.0 | |
| $Ta_2O_5$ | | | | | 5.0 | |
| Glass Appearance | opal | clear | clear | clear | some crystals | clear |
| Crystalization Heat Treatment | | | | | | |
| °C. for 16 Hours + | 700 | 700 | 700 | 700 | 700 | 700 |
| °C. for 1 Hour | 1260 | 1260 | 1260 | 1200 | 1260 | 1260 |
| Deflection in mm at °C. for ½ hour | | | | | | |
| 1000 | | | 0 | 0 | 0 | 0 |
| 1100 | | | 0 | 0.8 | 0.9 | 0.5 |
| 1200 | 0.9 | 0.6 | 0.2 | >3 | 2.1 | 2.1 |
| 1250 | 4.0 | 4.0 | 2.0 | | | |
| Sheet Resistivity (Ω/□) after "P" doping at ½ hour at °C. | | | | | | |
| 1000 | 28 | 33 | 27 | 29 | 47 | 30 |
| 1100 | 3 | 8 | 2 | | 8 | |
| 1200 | 2 | 4 | 2 | | | |
| Example # | 25 | 26 | 27 | 28 | 29 | 30 |
| Mole % | | | | | | |
| $SiO_2$ | 20.0 | 20.0 | 25.0 | 22.5 | 15.7 | 22.5 |
| $Al_2O_3$ | 20.0 | 16.7 | 13.3 | 21.7 | 24.7 | 21.7 |
| $B_2O_3$ | 50.0 | 55.0 | 55.0 | 45.0 | 47.3 | 45.0 |
| RO | 10.0 | 8.3 | 6.7 | 8.8 | 12.3 | 10.8 |
| MgO | 5.0 | 3.3 | | 8.8 | 7.3 | 5.8 |
| CaO | | | | | | |
| SrO | 5.0 | 5.0 | 6.7 | | 5.0 | 5.0 |
| BaO | | | | | | |
| $Al_2O_3$/RO | 2 | 2 | 2 | 2.5 | 2 | 2 |
| $La_2O_3$ | | 2.0 | | 2.0 | | |
| $Nb_2O_3$ | | | | | | |
| $Ta_2O_5$ | | | | | | |
| Glass Appearance | some crystals | clear | clear | clear | some crystals | clear |
| Crystallization Heat Treatment | | | | | | |
| °C. for 16 Hours + | 700 | 700 | 700 | 700 | 700 | 700 |
| °C. for 1 Hour | 1260 | 1260 | 1040 | 1260 | 1260 | 1260 |
| Sag Test Deflection in mm at °C. for ½ hour | | | | | | |
| 1000 | 0 | 0 | 0.1 | 0 | 0 | 0 |
| 1100 | 0.1 | 0.0 | | 0 | 0 | 0 |
| 1200 | 1.0 | 0.8 | | 3.5 | 0.7 | 0.8 |
| 1250 | 4.3 | 5.0 | | | 4.0 | 3.5 |
| Sheet Resistivity (Ω/□) after "P" doping at ½ hour at °C. | | | | | | |
| 1000 | 32 | 33 | 30 | 30 | 31 | 32 |
| 1100 | | 9 | | 11 | 9 | 8 |
| 1200 | | | | | | |
| Example # | 31 | 32 | 33 | 34 | 35 | |
| Mole % | | | | | | |
| $SiO_2$ | 25.0 | 25.0 | 15.7 | 15.7 | 10.0 | |
| $Al_2O_3$ | 23.3 | 23.3 | 24.7 | 24.7 | 30.0 | |
| $B_2O_3$ | 40.0 | 40.0 | 47.3 | 47.3 | 45.0 | |
| RO | 9.7 | 11.7 | 12.3 | 7.3 | 10.0 | |
| MgO | 9.7 | 6.7 | 7.3 | 7.3 | 10.0 | |
| CaO | | | | | | |
| SrO | | 5.0 | | | | |
| BaO | | | 5.0 | | | |
| $Al_2O_3$/RO | 2.4 | 2 | 2 | 3.4 | 3 | |
| $La_2O_3$ | 2.0 | | | | 5.0 | |

Table II-continued

| | 36 | 37 | 38 | 39 | 40 |
|---|---|---|---|---|---|
| Nb$_2$O$_5$ | | | | | |
| Ta$_2$O$_5$ | | | | 5.0 | |
| Glass Appearance | clear | clear | some crystals | clear | some crystals |
| Crystallization Heat Treatment | | | | | |
| °C. for 16 Hours + | 700 | 700 | 700 | 700 | 700 |
| °C. for 1 Hour | 1260 | 1260 | 1260 | 1260 | 1260 |
| Sag Test Deflection in mm at °C. for ½ hour | | | | | |
| 1000 | 0 | 0 | 0 | 0 | 0 |
| 1100 | 0 | 0 | 0 | 0 | 0.5 |
| 1200 | 1.3 | 0.3 | 0.3 | 0.8 | 4.6 |
| 1250 | 5.0 | 2.9 | | 4.5 | |
| Sheet Resistivity (Ω/□) after "P" doping at ½ hour at °C. | | | | | |
| 1000 | 32 | 32 | 35 | 36 | 30 |
| 1100 | 9 | 8 | 9 | 9 | |
| 1200 | | | | | |

| Example # | 36 | 37 | 38 | 39 | 40 |
|---|---|---|---|---|---|
| Mole % | | | | | |
| SiO$_2$ | 15.0 | 15.0 | 15.0 | 22.5 | 20.0 |
| Al$_2$O$_3$ | 31.7 | 16.7 | 21.7 | 21.7 | 20.0 |
| B$_2$O$_3$ | 37.5 | 60.0 | 52.5 | 45.0 | 50.0 |
| RO | 10.8 | 8.3 | 9.5 | 9.5 | 5.0 |
| MgO | 10.8 | 3.3 | 5.8 | 5.8 | 5.0 |
| CaO | | | | | |
| SrO | | 5.0 | | | |
| BaO | | | | | |
| Al$_2$O$_3$/RO | 3 | 2.0 | 3.7 | 3.7 | 4 |
| La$_2$O$_3$ | 5.0 | | | | |
| Nb$_2$O$_5$ | | | | | |
| Ta$_2$O$_5$ | | | 5.0 | 5.0 | 5.0 |
| Glass Appearance | some crystals | some crystals | opal | some crystals | some crystals |
| Crystallization Heat Treatment | | | | | |
| °C. for 16 Hours + | 700 | 700 | 700 | 700 | 700 |
| °C. for 1 Hour | 1260 | 1260 | 1260 | 1260 | 1260 |
| Sag Test Deflection in mm at °C. for ½ hour | | | | | |
| 1000 | 0 | 0 | 0 | 0 | 0 |
| 1100 | 0.5 | 0 | 0 | 0 | 0 |
| 1200 | 3.0 | 1.3 | 0.6 | 0.6 | 0 |
| 1250 | | >3 | >3 | >3 | |
| | | >3 | | | |
| Sheet Resistivity (Ω/□) after "P" doping at ½ hour at °C. | | | | | |
| 1000 | 28 | 36 | 37 | 31 | 34 |
| 1100 | | 10 | 10 | 9 | 9 |
| 1200 | | | | | |

To further demonstrate the principles of the present invention, several different barium aluminosilicate glass-ceramic dopant hosts are prepared and evaluated in doping by the methods of Example 1. The results are set forth below in Table III.

Table III

| Example # | 41 | 42 | 43 | 44 |
|---|---|---|---|---|
| Mole % | | | | |
| SiO$_2$ | 29.4 | 30.3 | 31.4 | 28.8 |
| Al$_2$O$_3$ | 22.9 | 23.8 | 24.4 | 22.4 |
| B$_2$O$_3$ | 34.3 | 32.0 | 30.0 | 33.6 |
| RO | 13.5 | 13.9 | 14.2 | 15.2 |
| BaO | 2.0 | 2.0 | 2.0 | 4.0 |
| MgO | 11.5 | 11.9 | 12.2 | 11.2 |
| Al$_2$O$_3$/RO | 1.7 | 1.71 | 1.72 | 1.48 |
| Glass Appearance | clear | clear | clear | clear |
| Crystallization Heat Treatment | | | | |
| °C. for (Hours) + | 720(16) | 720(16) | 720(16) | 720(16) |
| °C. for (Hours) | 1090(3) | 1090(3) | 1090(3) | 1090(3) |
| Sheet Resistivity (Ω/□) after "P" Doping at ½ Hr. At °C. | | | | |
| 1000 | 35 | | | |
| 1100 | 8.6 | | | |
| 1150 | | 5.5 | 5.0 | 5.4 |
| 1200 | | | | |

| Example # | 45 | 46 | 47 |
|---|---|---|---|
| Mole % | | | |
| SiO$_2$ | 28.0 | 33.3 | 33.3 |
| Al$_2$O$_3$ | 24.1 | 22.3 | 26.73 |
| B$_2$O$_3$ | 24.1 | 22.3 | 26.73 |
| RO | 14.9 | 11.1 | 6.67 |
| BaO | 4.0 | 11.1 | 6.67 |
| MgO | 10.9 | | |
| Al$_2$O$_3$/RO | 1.62 | 2.01 | 4.00 |
| Glass Appearance | clear | clear | clear |
| Crystallization Heat Treatment | | | |
| °C. for (Hours) + | 720(16) | 720(1) | 1150(½) |
| °C. for (Hours) | 1090(3) | 1150(2) | |
| Sheet Resistivity (Ω/□) after "P" Doping at ½ Hr. At °C. | | | |
| 1000 | | | |
| 1100 | | | |
| 1150 | 5.0 | 5.4 | 5.4 |
| 1200 | | | |

At the end of diffusion doping the thin dopant host wafers have not slumped or otherwise physically deformed to render them unsuitable for further diffusion doping process. Example 44 illustrates that an Al$_2$O$_3$/RO ratio of 1.48 is about 1.5 and within the scope of the present invention for the purpose of providing dimensional stability under doping conditions.

Having thus described the invention, what is claimed is:

1. A glass-ceramic body resulting from the in situ thermal crystallization of a thermally crysytallizable substantially alkali metal oxide free glass having a composition in mole percent consisting essentially of SiO$_2$ 15–40, Al$_2$O$_3$ 15–30, B$_2$O$_3$ 20–60, RO 5–25, La$_2$O$_3$ 0–5, Nb$_2$O$_5$ 0–5 and Ta$_2$O$_5$ 0–5, wherein
RO is one or more of MgO, CaO, SrO and BaO in the following mole percentages:
MgO:0–15
CaO:0–10
SrO:0–10
BaO:0–15 and
wherein the ratio Al$_2$O$_3$/RO is 1.5–4.

2. A glass-ceramic body of claim 1 resulting from the in situ thermal crystallization of a thermally crystallizable substantially alkali metal oxide free glass having a composition in mole percent consisting essentially of SiO$_2$ 18–40, Al$_2$O$_3$ 15–30, B$_2$O$_3$ 30–60 and RO 5–15 including 3–15 MgO, wherein the ratio Al$_2$O$_3$/RO is 2–4.

* * * * *

UNITED STATES PATENT AND TRADEMARK OFFICE
CERTIFICATE OF CORRECTION

PATENT NO. : 4,160,672
DATED : July 10, 1979
INVENTOR(S) : James E. Rapp

It is certified that error appears in the above–identified patent and that said Letters Patent are hereby corrected as shown below:

Col. 11, line 37, "Example 190" should be ---Example # ---.

Col. 13, lines 45 to 49 should be changed to read as follows:

| | | | | | |
|---|---|---|---|---|---|
| 1000 | 0 | 0 | 0 | 0 | 0 |
| 1100 | 0.5 | 0 | 0 | 0 | 0 |
| 1200 | 3.0 | 1.3 | 0.6 | 0.6 | 0 |
| 1250 | | >3 | >3 | >3 | >3 |

Col. 14, line 22, should read as follows:

$B_2O_3$   33.0   33.3   33.3

Signed and Sealed this

Twenty-seventh Day of November 1979

[SEAL]

Attest:

RUTH C. MASON
Attesting Officer

LUTRELLE F. PARKER
Acting Commissioner of Patents and Trademarks